US006845478B2

(12) United States Patent
Luong

(10) Patent No.: US 6,845,478 B2
(45) Date of Patent: Jan. 18, 2005

(54) METHOD AND APPARATUS FOR COLLECTING AND DISPLAYING BIT-FAIL-MAP INFORMATION

(75) Inventor: Jimmy Ba Luong, Cary, NC (US)

(73) Assignee: Infineon Technologies Richmond, LP, Sandston, VA (US)

(*) Notice: Subject to any disclaimer, the term of this patent is extended or adjusted under 35 U.S.C. 154(b) by 556 days.

(21) Appl. No.: 09/891,837

(22) Filed: Jun. 26, 2001

(65) Prior Publication Data

US 2002/0199140 A1 Dec. 26, 2002

(51) Int. Cl.$^7$ .......................... G06F 11/00; G11C 29/00; H02H 3/05
(52) U.S. Cl. ...................... 714/738; 714/718; 714/57; 714/31
(58) Field of Search .................... 714/724, 738, 714/739, 742, 718, 719, 723, 710, 57, 31, 25, 48, 46; 345/326, 163, 173, 33; 324/527, 528, 759, 763, 764, 765

(56) References Cited

U.S. PATENT DOCUMENTS 6,000,048 A * 12/1999 Krishna et al. ............. 714/718
6,421,798 B1 * 7/2002 Lin et al. .................... 714/718
6,449,741 B1 * 9/2002 Organ et al. ................ 714/724
2002/0042897 A1 * 4/2002 Klein et al. ................. 714/718

\* cited by examiner

*Primary Examiner*—Christine T. Tu
(74) *Attorney, Agent, or Firm*—Brinks, Hoffer Gilson & Lione

(57) ABSTRACT

Disclosed is a method of testing memory, comprising providing one or more semiconductor wafers having one or more semiconductor chips thereon, each said chip comprising one or more memory cells, providing a programmable testing apparatus comprising at least one test pattern generators and a test bed adapted to receive said one or more wafers in communicative contact so as to address individual memory cells, chips, and wafers and transmit information thereto and receive information therefrom, receiving one or more test commands, constructing a test sequence of one or more commanded tests from said test commands, constructing at least one header comprising location information for each said wafer, chip and memory cell, testing said memory cells with a test pattern generated by said test pattern generator, collecting the results of said testing and passing them to a display device, passing said location information to said display device, constructing and displaying a graphical representation of said test results using said location information.

20 Claims, 5 Drawing Sheets

METHOD AND APPARATUS FOR COLLECTING AND DISPLAYING BIT-FAIL-MAP INFORMATION

BACKGROUND OF THE INVENTION

1. Field of the Invention

This invention relates to a method and apparatus of testing memory arrays and displaying the test results.

2. Discussion of the Related Art

In the manufacture of semiconductor wafers having multiple memory chips, or "chips" thereon it is known to "front-end" test the entire wafer to ensure the memory is functioning correctly. Memory testers sold under the "Advantest" mark, will usually have software available for this purpose. Advantest has available a software program sold under the tradename "AQUA", which is compatible with most later models of Advantest-brand memory testers, though not the earlier models. The main drawback of such "front-end" systems is that they test all the chips on a wafer and are unable to test chips individually. Another drawback is that they usually lack a display interface that permits pinpointing individual memory cell failures on individual chips or to allow the user to conveniently tailor memory tests to his own uses.

SUMMARY OF THE INVENTION

Disclosed is a method of testing memory, comprising providing one or more semiconductor wafers having one or more semiconductor chips thereon, each said chip comprising one or more segments, each said segment comprising one or more memory cells; providing a programmable testing apparatus comprising one or more test pattern generators and a test bed adapted to receive said one or more wafers in communicative contact so as to address individual memory cells, segments, chips, and wafers and transmit information thereto and receive information therefrom; receiving one or more test commands; constructing a test sequence of one or more commanded tests from said test commands; constructing at least one header comprising location information for each said wafer, chip, segment, and memory cell; testing said memory cells with one or more test patterns generated by said test pattern generator; collecting the results of said testing and passing them to a display device; passing said location information to said display device; constructing and displaying a graphical representation of said test results using said location information.

In another aspect of the method a header is constructed for each commanded test.

In another aspect of the method said graphical representation comprises a wafer display comprising a plurality of first graphical objects, each representing a chip, arranged spatially in accordance with the physical location of each said chip on said wafer.

In another aspect of the method said wafer display further comprises an indication of failed chips.

In another aspect of the method said wafer display further comprises an indication of which chip is currently being tested.

In another aspect of the method said wafer display further comprises an indication of which chips have been tested.

In another aspect of the method said graphical representation further comprises a chip display comprising a plurality of second graphical objects, each representing a segment.

Another aspect of the method further comprises an indication of failed segments.

In another aspect of the method said graphical representation further comprises a segment display comprising graphical objects for each segment within a chip and further comprising an indication of which segment is currently being tested.

In another aspect of the method said graphical representation further comprises a segment information display comprising graphics for displaying detailed segment information and the locations of any failed memory cells.

Disclosed is a program storage device, readable by machine, tangibly embodying a program of instructions executable by the machine to perform method steps for testing semiconductor memory, the method comprising providing one or more semiconductor wafers having one or more semiconductor chips thereon, each said chip comprising one or more segments, each said segment comprising one or more memory cells; providing a programmable testing apparatus comprising one or more test pattern generators and a test bed adapted to receive said one or more wafers in communicative contact so as to address individual memory cells, segments, chips, and wafers and transmit information thereto and receive information therefrom; receiving one or more test commands; constructing a test sequence of one or more commanded tests from said test commands; constructing at least one header comprising location information for each said wafer, chip, segment, and memory cell; testing said memory cells with one or more test patterns generated by said test pattern generator; collecting the results of said testing and passing them to a display device; passing said location information to said display device; constructing and displaying a graphical representation of said test results using said location information.

In another aspect of the apparatus a header is constructed for each commanded test.

In another aspect of the apparatus said graphical representation comprises a wafer display comprising a plurality of first graphical objects, each representing a chip, arranged spatially in accordance with the physical location of each said chip on said wafer.

In another aspect of the apparatus said wafer display further comprises an indication of failed chips.

In another aspect of the apparatus said wafer display further comprises an indication of which chip is currently being tested.

In another aspect of the apparatus said wafer display further comprises an indication of which chips have been tested.

In another aspect of the apparatus said graphical representation further comprises a chip display comprising a plurality of second graphical objects, each representing a segment.

In another aspect of the apparatus said graphical representation further comprises a segment information display comprising graphics for displaying detailed segment information and the locations of any failed memory cells.

In another aspect of the apparatus said chip display appears for any one chip when a user mouse-clicks on a corresponding said first graphical object.

In another aspect of the apparatus said segment information display appears for any one segment when a user mouse-clicks on a corresponding said second graphical object.

DETAILED DESCRIPTION OF THE
PREFERRED EMBODIMENTS

Figure 1:
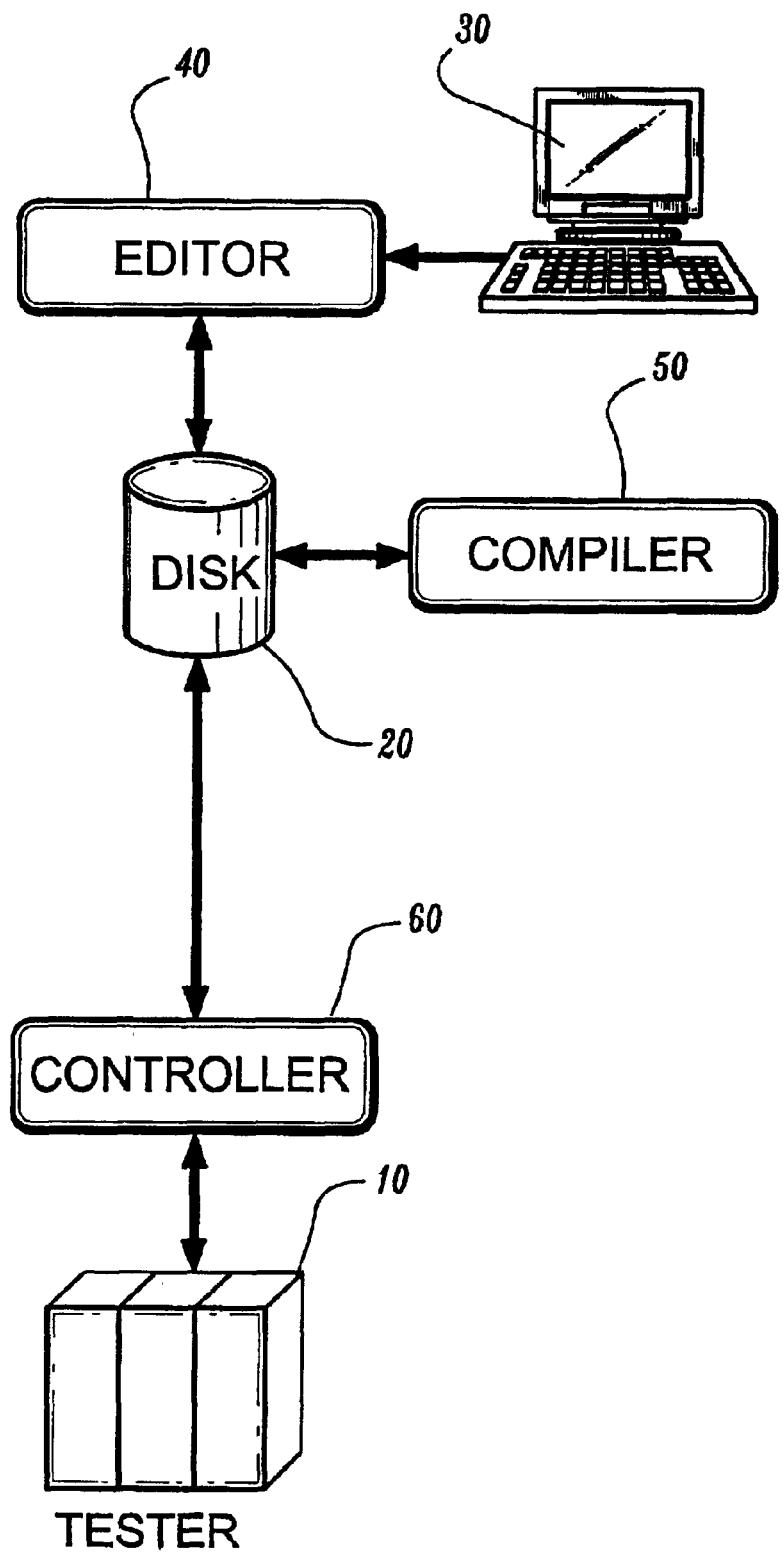
FIG. 1 is a diagram of a system upon which the method of the invention may be implemented.

Referring to FIG. 1, there is shown an overview of an embodiment of the invention in which there is provided a memory tester 10 in communication, via a controller 60, with a viewing database on a storage medium 20 that is in turn in communication, either directly or via an editor 40, with a display device 30, such as a personal computer, workstation, or the like. The memory tester 10 is either linked to, or itself contains, an apparatus for executing programmable instructions, such as a central processing unit (CPU) and memory, or other device effective in executing the methods of this invention. An external compiler 50 may be provided where the tester 10 lacks compilation means. The external compiler 50 will generally be an apparatus for executing programmable instructions and may itself be part of a computer system that includes the display unit 30, an editor 40, and the database 20, or any combination thereof. A controller 60 controls communication between the storage medium 20 and the tester 10. The compiler will compile software programmed with the method of the invention and store it on the disk 20 for execution. It is not necessary, however, that the same disk hold both the software and the database.

The tester 10 will preferable have the following characteristics (a) it is capable of addressing individual chips on a wafer, (b) will be capable of addressing individual memory cells in each of the chips, (c) will be capable of generating test patterns, and (d) will be capable of providing test data in a form suitable for storage on a computer usable medium. Suitable memory testers that are commercially available include those sold by Advantest Corporation and designated by product codes T5581H, T5585, T5591, and T5592, amongst others. These models are programmable testers comprising one or more test pattern generators and a test bed adapted to receive a number of wafers in electronic communicative contact so as to be able to address individual memory cells, chips, and wafers and transmit information thereto and receive information therefrom. They also have data output means so as to be able to transmit data to an external database or computer.

The database may be any usable database, such as most commercially available relational databases. Alternatively, the database can simply be a stored file.

The display device 30 may be any suitable device, usually a computer terminal.

Figure 2:
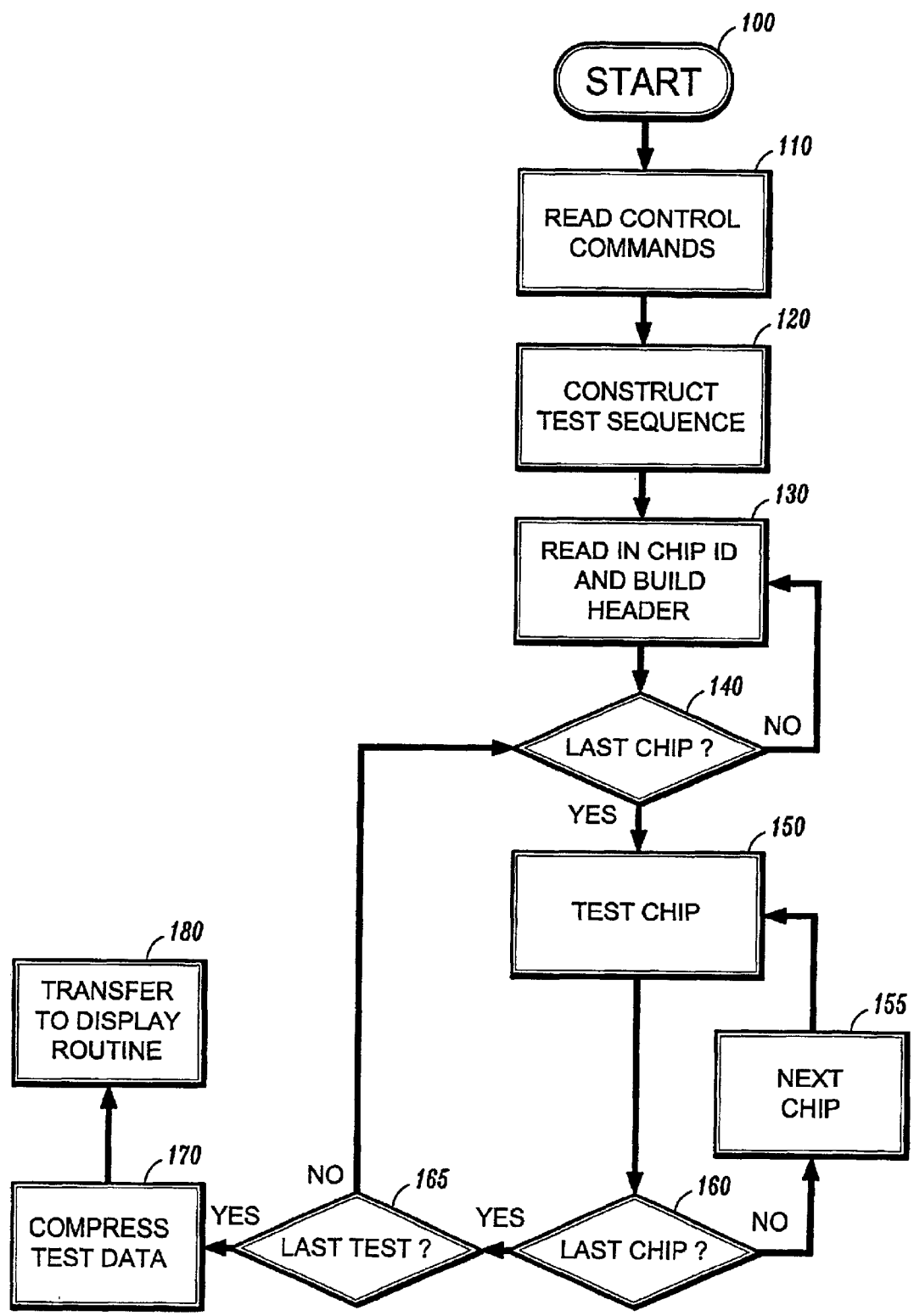
FIG. 2 is a flowchart of the method of the invention.

Referring to FIG. 2, there is shown a flow chart of the method of the invention. The process is entered at 100 into the reading 110 of one or more control commands. The commands may be read from a file, from user input, system events, or any other suitable sources or computer-usable medium from which commands may be read. The commands may be instructions to test all or a portion of the bits in a memory device, to test each bit's ability to read and/or write zeros or ones or both, or any other test suitable to a memory device and within the capabilities of the memory tester 10 chosen.

From the read command, control flows to 120 wherein a sequence of commanded tests is constructed from the read commands. This will usually be in the form of a subroutine that constructs a sequence of commands in a language or form understood by the testing device 10.

Control now flows to 130 where the chip IDs, or other suitable identifier, for each chip in each wafer placed in the memory tester 10 for testing are read in. A unique header is constructed for each test. The header is for the use of the display module and may comprise information about each chip useful for testing and display of results, such as an identifier (e.g., a name) for the test, X-Y coordinates, or other positional information, for each chip, and wafer number, useful for identification, and any other information as needed or desired by the user. A data file is then opened for each test, and an individual header assigned. The result is that there is a header for each test.

Control now flows to the actual testing of the chips 150. This can occur after all headers have been constructed, as shown in the flow chart. Alternatively, each chip could be tested immediately after each header is constructed. Regardless, the testing of chips follows the test sequence that was constructed at 120, proceeding one pattern at a time. A "pattern" is a stream of logical 0's and 1's that are read and written to the memory cells of the chips. The pattern, because it is a stream of high and low voltages, is essentially a waveform and the device that provides the pattern is basically a form of waveform generator. Testing of the individual cells is in the nature of writing a logical 0 or 1 to each cell and then reading the cell to see if the information was successfully stored. The testing may be carried out at ever higher speeds (i.e., higher pattern waveform frequencies) to test how rapidly the memory cells are able to respond. In one embodiment of the invention, the testing is in the nature of a "Bit-Fail-Map" routine, wherein the spatial and/or logical positions of each chip are used to generate a graphical image or "map" of the failed chips on each wafer.

After all the chips have been tested, control flows to decision node 165. If there are any further tests in the test sequence, control goes back to node 140, otherwise testing ends.

After all testing is completed, control now flows to 170 where the results of the testing 150 are received and stored. The data may be compressed, if desired.

The stored data from 170 is received control box 180 in the schematic where the data is transferred to a viewing database 20 for display processing. This may be in the form of a background application, such as a so-called "CRONTAB" job, which is the UNIX name for an application that runs in the background.

Figure 3:
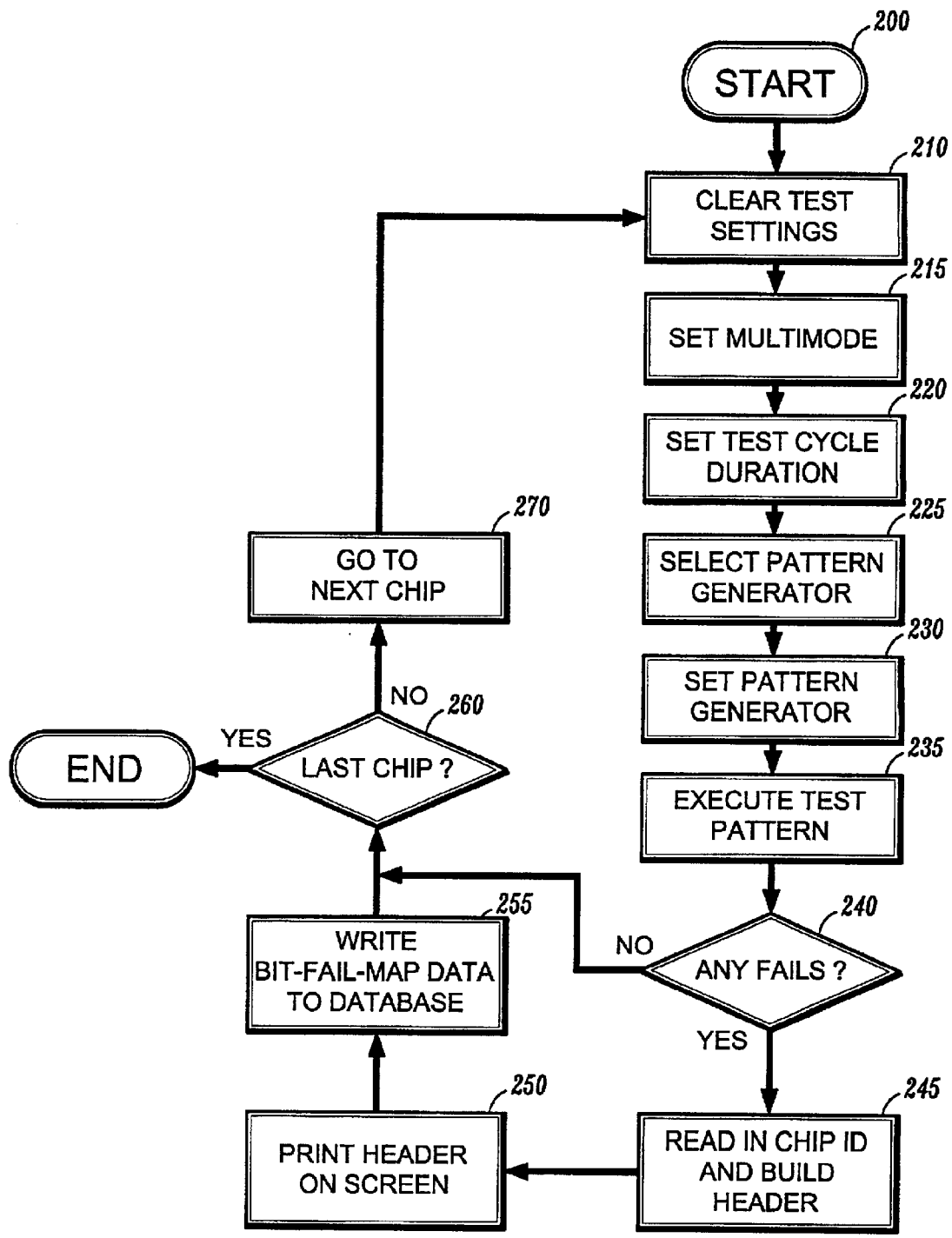
FIG. 3 is a flowchart of a testing operation.

Referring to FIG. 3, in another embodiment of the invention, the headers are built on a test-by-test basis. The flowchart of FIG. 3 corresponds to the boxes 150, 155, and 160 from FIG. 2. For each chip there are one or more tests to be performed. The flow of control enters the flowchart at 200 and begins with the clearing or resetting of test settings at box 210. This is to ensure that no settings from a previous test are inadvertently included in a subsequent test.

Next, the various test settings are set for the next test, for example the multimode of the testing machine may be set to single to test one chip at a time or to multi to test several chips simultaneously, the test cycle duration is set, a pattern generator is selected and set, and any other requisite settings as needed or desired.

At box 235, the test is executed and then control flows to decision box 240. If no failures were detected in any of the bits, then the rest of the steps are skipped and control flows to the next chip, if any. Otherwise, (assuming this was not done at boxes 130 and 140 from FIG. 2) the chip ID is read in and a header built for the test as was described above. Control then flows to box 250 where the header is displayed on a screen, and then to box 255, where data regarding the bit failures are stored in the database (20 from FIG. 1). The data will be either in the form of a bit-fail-map, or will contain sufficient data to construct a bit-fail-map for the test. The bit-fail-map will contain the spatial and/or logical locations of the failed bits in the memory array. At decision box 260, the loop ends if the last test has been performed, otherwise control flows back to box 210 for the next test in the sequence.

Figure 4:
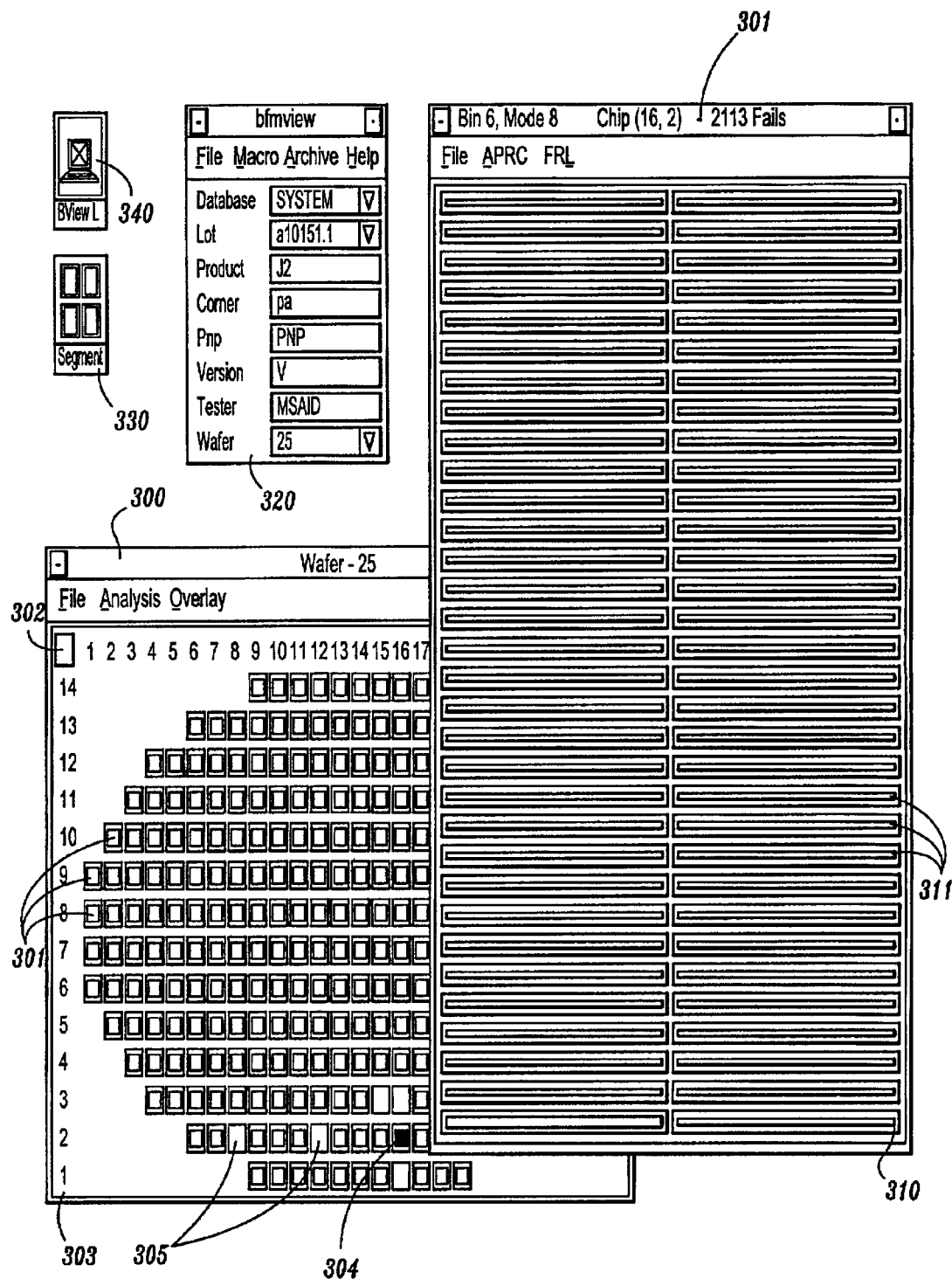
FIG. 4 shows various display embodiments.
Figure 5:
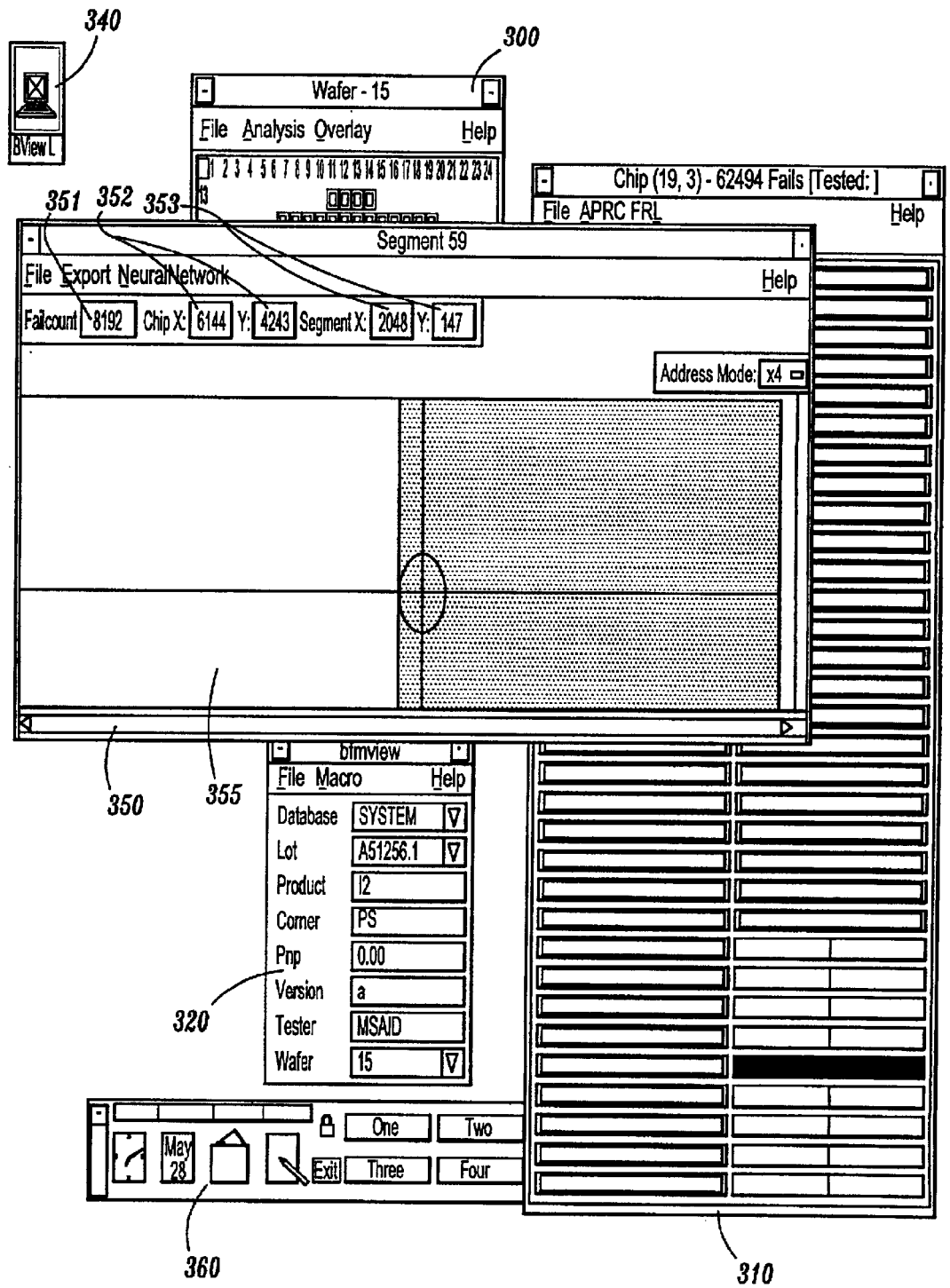
FIG. 5 shows various additional display embodiments.

Referring to FIG. 4, the display of bit failure data will preferably indicate the spatial and/or logical positions of the failed bits. In the embodiment of FIG. 4, this is achieved in a windowed operating system by the use of a plurality of windows each having a display therein, though the displayed information could also be displayed in a single window most users will likely find a multi-windowed to be more user-friendly. Hence, a graphical spatial representation of a tested wafer may be shown in a wafer display 300 comprising a plurality of graphical objects, each representing a chip, arranged spatially as the actual chips are on the actual wafer. As seen in the figure, the graphical objects representing individual chips combine to form a generally circular pattern corresponding to the shape of the tested wafer. X-coordinate labels 302 and y-coordinate labels 303 may also be provided. The positioning and labeling of the objects 301 is easily done using the location information (e.g., x and y coordinates) obtained from the header for each test.

The wafer display 300 will also preferably have some indication of the failed chips, such as in the figure where a failed chip 304 is displayed as a graphical object of a different color or shade than those for functioning memory cells. Graphical objects may also be shaded 305 or otherwise distinguished so as to indicate other information, such as which chip is currently under investigation or which chips have already been tested, and so forth.

A chip display 310 may be a desirable option and may display useful information 301 such as the coordinates of a particular chip and the number of failed memory cells in the chip. A plurality of graphical objects 311 may be provided, each corresponding to a segment of memory within a particular chip and optionally arranged in accordance with the geometry of the chip, such that by mouse-clicking any of the segment graphical objects, information regarding the corresponding segment is made to appear (see FIG. 6). A typical chip at the time of this writing will have about 64 segments. In a preferred embodiment, a failed segment will be indicated, such as by highlighting or coloring the graphical objects. In a preferred embodiment, the chip display 310 for a particular chip may be made to appear by mouse-clicking on the chip's corresponding graphical object in the wafer display 300.

Other displays that may be found useful are a header display 320 that displays the information in the header for the chip being displayed, a segment display 330 comprising graphical objects for each segment within a chip that may be highlighted to indicate which segment is currently under testing or other information (alternatively, these indications may be incorporated into the chip display 310), and a control display 340 for setting and/or displaying display options.

Referring to FIG. 6, there is shown a preferred segment information display 350 for displaying detailed information regarding a segment selected from the chip display 310. Useful information regarding the testing of memory cells within the segment may be displayed at the in the segment information display 350, such as a tally of failed cells 351, the identifier or location of the chip 352, the identifier or location of the segment 352, and preferably a graphics display 355 showing the location of any failed memory cells.

A file display 360 may also be provided for standard file handling procedures such as opening or closing files and editing information through cut and paste operations and the like.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of testing memory, comprising:
providing one or more semiconductor wafers having one or more semiconductor chips thereon, each said chip comprising one or more segments, each said segment comprising one or more memory cells;
providing a programmable testing apparatus comprising one or more test pattern generators and a test bed adapted to receive said one or more wafers in communicative contact so as to address individual memory cells, segments, chips, and wafers and transmit information thereto and receive information therefrom;
receiving one or more test commands;
constructing a test sequence of one or more commanded tests from said test commands;
constructing at least one header comprising identification information for at least one of said wafer, chip, segment, and memory cell, wherein said identification information comprises location information for at least one of said wafer, chip, segment, and memory cell, and a test identifier for the test sequence to be applied to at least one of said wafer, chip, segment, and memory cell;
testing at least one of said wafer, chip, segment, and memory cell with the test sequence using one or more test patterns generated by said test pattern generator;
collecting the results of said testing and passing them to a display device;
passing said identification information to said display device;
constructing and displaying a graphical representation of said test results using said identification information.

2. The method of claim 1 wherein a header is constructed for each commanded test.

3. The method of claim 1 wherein said graphical representation comprises a wafer display comprising a plurality of first graphical objects, each representing a chip, arranged spatially in accordance with the physical location of each said chip on said wafer.

4. The method of claim 3 wherein said wafer display further comprises an indication of failed chips.

5. The method of claim 3 wherein said wafer display further comprises an indication of which chip is currently being tested.

6. The method of claim 3 wherein said wafer display further comprises an indication of which chips have been tested.

7. The method of claim 1 wherein said graphical representation further comprises a chip display comprising a plurality of second graphical objects, each representing a segment.

8. The method of claim 7 further comprising an indication of failed segments.

9. The method of claim 1 wherein said graphical representation further comprises a segment display comprising graphical objects for each segment within a chip and further comprising an indication of which segment is currently being tested.

10. The method of claim 1 wherein said graphical representation further comprises a segment information display comprising graphics for displaying detailed segment information and the locations of any failed memory cells.

11. A program storage device, readable by machine, tangibly embodying a program of instructions executable by the machine to perform method steps for testing semiconductor memory, the method comprising:

providing one or more semiconductor wafers having one or more semiconductor chips thereon, each said chip comprising one or more segments, each said segment comprising one or more memory cells;

providing a programmable testing apparatus comprising one or more test pattern generators and a test bed adapted to receive said one or more wafers in communicative contact so as to address individual memory cells, segments, chips, and wafers and transmit information thereto and receive information therefrom;

receiving one or more test commands;

constructing a test sequence of one or more commanded tests from said test commands;

constructing at least one header comprising identification information for at least one of said wafer, chip, segment, and memory cell, wherein said identification information comprises location information for at least one of said wafer, chip, segment, and memory cell, and a test identifier for the test sequence to be applied to at least one of said wafer, chip, segment, and memory cell;

testing at least one of said wafer, chip, segment, and memory cell with the test sequence using one or more test patterns generated by said test pattern generator;

collecting the results of said testing and passing them to a display device;

passing said identification information to said display device; constructing and displaying a graphical representation of said test results using said identification information.

12. The apparatus of claim 11 wherein a header is constructed for each commanded test.

13. The apparatus of claim 11 wherein said graphical representation comprises a wafer display comprising a plurality of first graphical objects, each representing a chip, arranged spatially in accordance with the physical location of each said chip on said wafer.

14. The apparatus of claim 13 wherein said wafer display further comprises an indication of failed chips.

15. The apparatus of claim 13 wherein said wafer display further comprises an indication of which chip is currently being tested.

16. The apparatus of claim 13 wherein said wafer display further comprises an indication of which chips have been tested.

17. The apparatus of claim 11 wherein said graphical representation further comprises a chip display comprising a plurality of second graphical objects, each representing a segment.

18. The apparatus of claim 17 wherein said chip display appears for any one chip when a user mouse-clicks on a corresponding graphical object, wherein said graphical object represents a chip, arranged spatially in accordance with the physical location of said chip on said wafer.

19. The apparatus of claim 11 wherein said graphical representation further comprises a segment information display comprising graphics for displaying detailed segment information and the locations of any failed memory cells.

20. The apparatus of claim 19 wherein said segment information display appears for any one segment when a user mouse-clicks on a corresponding said graphical object, wherein said graphical object represents a segment.

* * * * *